(12) United States Patent
Fujikawa (10) Patent No.: US 8,077,468 B2
(45) Date of Patent: Dec. 13, 2011

(54) RAIL COUPLING HANDLE, UNIT SUPPORT MECHANISM AND ELECTRONIC DEVICE

(75) Inventor: Hideyuki Fujikawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/320,743

(22) Filed: Feb. 3, 2009

(65) Prior Publication Data
US 2009/0141457 A1   Jun. 4, 2009

Related U.S. Application Data (63) Continuation of application No. PCT/JP2006/318634, filed on Sep. 20, 2006.

(51) Int. Cl.
*H05K 5/00* (2006.01)
*H05K 7/00* (2006.01)

(52) U.S. Cl. .................. 361/727; 361/679.36

(58) Field of Classification Search ............ 361/679.36, 361/727
See application file for complete search history.

(56) References Cited

U.S. PATENT DOCUMENTS

| | | | |
|---|---|---|---|
| 4,941,841 A * | 7/1990 | Darden et al. | 361/679.39 |
| 5,654,873 A | 8/1997 | Smithson et al. | |
| 5,767,445 A * | 6/1998 | Wu | 174/542 |
| 5,978,212 A | 11/1999 | Boulay et al. | |
| 6,008,984 A * | 12/1999 | Cunningham et al. | 361/679.31 |
| 7,345,237 B2 * | 3/2008 | Chen et al. | 174/50 |

FOREIGN PATENT DOCUMENTS

| | | |
|---|---|---|
| CN | 2487014 | 4/2002 |
| JP | 60-82795 | 6/1985 |
| JP | 2-113375 | 9/1990 |
| JP | 6-56883 | 8/1994 |
| JP | 2000-260522 | 9/2000 |
| JP | 2003-133765 | 5/2003 |
| JP | 2003-153307 | 5/2003 |

OTHER PUBLICATIONS

Lenovo Japan "Paso-con tool-less kyotai de jikan to cost no sakugen ni koken (Contribution to a reduction in time and cost with personal computer tool-less chassis)", retrieved on Aug. 14, 2006, retrieved from the Internet www-06.ibm.com/jp/pc/tcs50us/detail2.shtml.
International Search Report for PCT/JP2006/318634, mailed Nov. 7, 2006.
"Chinese Office Action", mailed by CN Patent Office and corresponding to Chinese application No. 200680055712.7 on Jan. 26, 2011, with English translation.

* cited by examiner

*Primary Examiner* — Anthony Haughton
(74) *Attorney, Agent, or Firm* — Fujitsu Patent Center (57) ABSTRACT

A disclosed rail coupling member couples a pair of rail members to be attached to lateral sides of a unit that is detachably supported in an electronic device. The rail coupling member is a flexible and discrete unit, and is not part of the rail members. The rail coupling member has end portions to which the rail members are to be joined, respectively, in a separable manner.

7 Claims, 6 Drawing Sheets

RAIL COUPLING HANDLE, UNIT SUPPORT MECHANISM AND ELECTRONIC DEVICE

CROSS-REFERENCE TO RELATED APPLICATIONS

The present application is a continuation application filed under 35 U.S.C. 111(a) claiming benefit under 35 U.S.C. 120 and 365(c) of PCT International Application No. PCT/JP2006/318634, filed on Sep. 20, 2006, the entire contents of which are incorporated herein by reference.

FIELD

The present disclosure relates to a unit support mechanism for supporting a unit in a detachable manner, a rail coupling member used in a unit support mechanism, and an electronic device having a unit support mechanism.

BACKGROUND

It is often the case that independent units, such as hard disk units, are mounted in personal computers and other electronic devices. Such a unit functions when mounted on the chassis of the electronic device and then connected with wire. Specifically, in the chassis of the electronic device, a space is preliminarily provided for mounting the unit. After placed in the space, the unit is then connected to other components of the electronic device with wire.

An independent unit, such as a hard disk unit, generally has a flat rectangular solid shape, and a pair of rail members for engaging with the lateral sides of the unit and also engaging with a slot, which is formed in the chassis of the electronic device, is often used in order to facilitate insertion of the unit into the slot where the unit is fixed in position.

The paired rail members are not part of the unit and are discrete components, and are attached to both lateral sides of the unit when the unit is mounted on the chassis or frame of the electronic device. After the rail members are attached, the unit is inserted into the slot of the chassis while the rail members and the unit are being supported. At this point, the rail members attached to the sides of the unit engage with rail channels formed on the lateral sides of the chassis so as to fit into the rail channels. In this manner, the unit is supported on the chassis by the rail members. A projection protruding outward is provided at an end of each rail member, and these projections fit into openings formed on the lateral sides of the chassis, whereby the rail members and the unit are fixed to the chassis in an integrated manner.

The unit needs to be taken out, for example, when it is replaced. To take out the unit from the chassis, the engagement of the projections and openings is released. In this manner, the unit is pulled out from the chassis together with the rail members. In order to disengage the projections of the rail members from the openings on the chassis, the ends of the respective rail members on which the projections are provided are elastically deformed inward. Then, the rail members are pulled so as to be displaced in relation to the chassis. The rail members are further pulled until the unit is finally pulled out from the chassis together with the rail members.

The rail members described above are separately supplied from the unit by, for example, a manufacturer or a distributor of the unit. Since allowing easy attachment/detachment of the unit to/from the chassis of the electronic device, the rail members are widely accepted in the market place.

According to a unit support mechanism by which the unit is supported on the chassis in a detachable manner using the conventional rail members, the rail members are attached to the sides of the unit in a simplified manner, and hence it is necessary to support and hold the paired rail members together with the unit at the time of attaching/detaching the unit. Thus, a person attaching/detaching the unit inevitably uses both hands to support the unit. In the case of mounting the unit, the unit can be inserted into the chassis by pushing the unit once the rail members enter the chassis to some extent. However, in the case of pulling out the unit, the person has to, while putting his/her both hands on the rail members, elastically deform the rail members by pushing the ends of the rail members sideways and pull out the unit with the projections of the rail members disengaged from the openings of the chassis. In this case, a relatively large space needs to be provided in the chassis where the unit is mounted so that the person can put his/her hands in. For example, if the unit is disposed in a deep and narrow place within the electronic device, the person cannot support the unit and the rail members with two hands, and thus, it is difficult to take out the unit. Therefore, a space needs to be provided where the unit is to be disposed, and thus wasted space is generated. Also, the unit is allowed to be disposed only where the space can be provided, which imposes restrictions on the design. In addition, since both hands are needed to detach the unit, the person cannot hold anything else in his/her hands when detaching the unit, thus causing problems in workability.

Given these factors, a unit support member allowing the unit to be attached/detached with one hand is proposed, and the unit support member is provided by integrally forming the left and right rail members and a handle connecting these rail members (for example, see Non-patent Document 1). The unit support member is made by plastic molding the rail members and the handle together, and a relatively large mold is required in the molding process, which leads to an increase in production cost. In addition, the handle connecting the paired rail members is made of plastic and formed, for example, by injection molding. Accordingly, the handle is relatively large in thickness, and hence, although being flexible to some degree, the handle cannot be readily bent. Consequently, wires led from the unit cannot be positioned along where the handle extends, and thus, the handle imposes restrictions on the wiring design. In addition to the rail members and the handle being integrally formed by plastic molding, another component for connecting the paired rail members, besides the handle, is also provided. Because of this structure, the width between the two rail members cannot be changed. As a result, the unit support member becomes specific to each model of such a unit, thus lacking versatility.

[Non-patent Document 1] Lenovo Japan, "Paso-con tool-less kyotai de jikan to cost no sakugen ni koken (Contribution to a reduction in time and cost with personal computer tool-less chassis)", retrieved on Aug. 14, 2006, retrieved from the Internet <URL: www-06. ibm.com/jp/pc/tcs50us/detail2.shtml>

SUMMARY

In order to achieve the above-mentioned objects, one aspect of the present disclosure is a rail coupling member for coupling a pair of rail members to be attached to lateral sides of a unit that is detachably supported in an electronic device. The rail coupling member is a flexible and discrete unit, and is not part of the rail members. The rail coupling member has end portions to which the rail members are to be joined, respectively, in a separable manner Another aspect of the present disclosure is a unit support mechanism for supporting a unit in an electronic device. The unit support mechanism includes a rail coupling member being a flexible and discrete unit; a pair of rail members coupled by the rail coupling member in a separable manner; and a frame for supporting the rail members. The rail members are joined to corresponding end portions of the rail coupling member in the separable manner and attached to lateral sides of the unit. The frame supports each of the rail members so that the unit is supported on the frame.

Yet another aspect of the present disclosure is an electronic device including a unit support mechanism for supporting a unit in the electronic device. The unit support mechanism includes a rail coupling member being a flexible and discrete unit; a pair of rail members coupled by the rail coupling member in a separable manner; and a frame for supporting the rail members. The rail members are joined to corresponding end portions of the rail coupling member in the separable manner and attached to lateral sides of the unit, and the frame supports each of the rail members so that the unit is supported on the frame.

The object and advantages of the invention will be realized and attained by means of the elements and combinations particularly pointed out in the claims.

It is to be understood that both the foregoing general description and the following detailed description are exemplary and explanatory and are not restrictive of the present disclosure as claimed.

DESCRIPTION OF EMBODIMENT

A preferred embodiment of the present disclosure is explained next with reference to the drawings.

Figure 1:
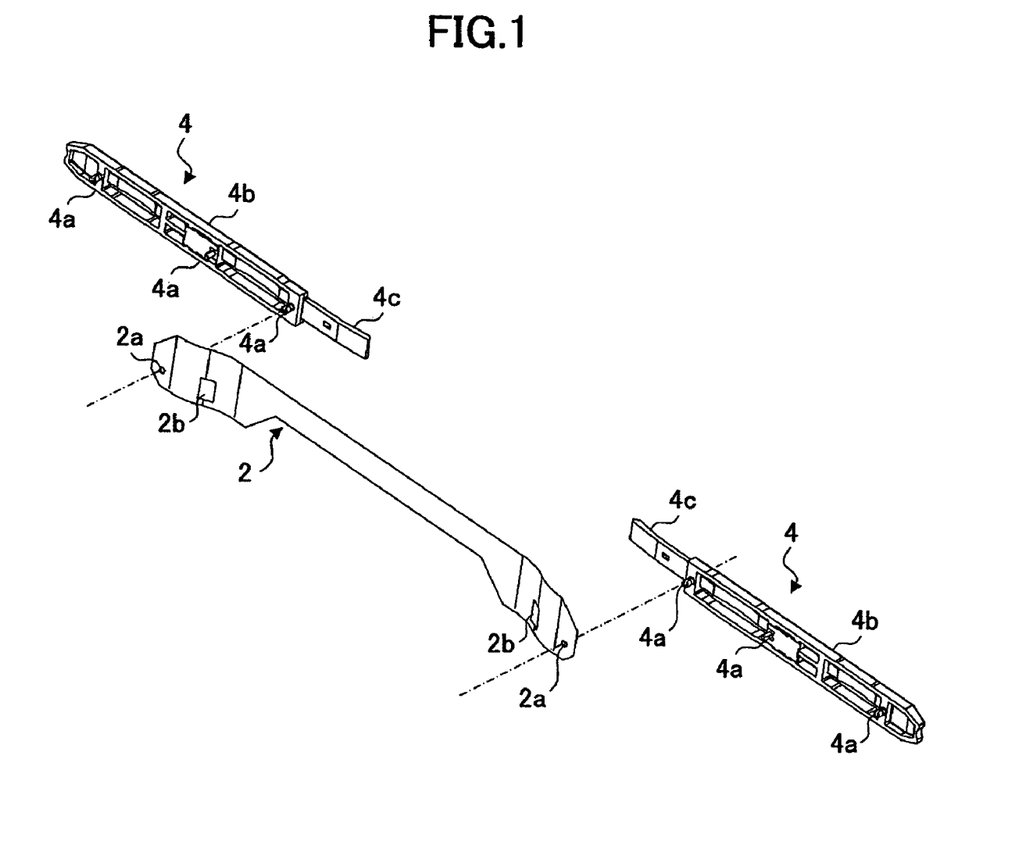
FIG. 1 is an exploded perspective view showing a rail coupling member and a pair of rail members coupled by the rail coupling member according to one embodiment of the present disclosure.

FIG. 1 is an exploded perspective view showing a rail coupling member 2 and a pair of rail members 4 coupled by the rail coupling member 2 according to the embodiment of the present disclosure.

The paired rail members 4 are generally made of plastic and have an elongated shape. In order to mount a unit, such as a hard disk device, on a chassis or frame of an electronic device, such as a computer, the rail members 4 are attached to the unit in such a manner as to be positioned along the right and left lateral sides of the unit (see FIG. 5). On each rail member 4, pins 4a are provided as projections which fit into pin holes formed on a lateral side of the unit to which the rail member 4 is attached. In the example illustrated in FIG. 1, three pins 4a are provided on each rail member 4. The pins 4a are inserted and fit into the pin holes on the lateral sides of the unit, whereby the rail members 4 are fixed to the lateral sides of the unit.

Each rail member 4 includes a rail portion 4b functioning as a guide rail and a support portion 4c extending from the rail portion 4b. The support portions 4c are provided so that, in the case of inserting the rail members 4 into rail channel portions (referred to as "slot") of the chassis or frame, a person grips the support portions 4c with hands, thereby supporting the unit together with the rail members 4. The support portions 4c of the rail members 4 are configured in such a manner as to protrude outside the slot when the unit is inserted into the slot. Accordingly, the unit is pulled out from the slot together with the rail members 4 by grasping and pulling the support portions 4c of the right and left rail members 4.

Figure 2:
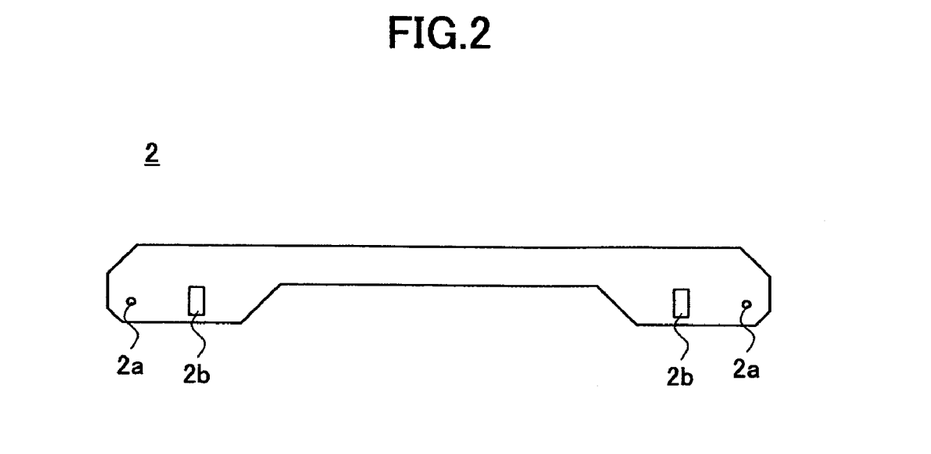
FIG. 2 is a plan view of the rail coupling member of the embodiment.

The rail coupling member 2 is a flexible sheet member used for coupling the above-described paired rail members 4. The rail coupling member 2 is formed of a thin plastic sheet, for example, a PET sheet or a mylar sheet having a thickness between about 0.2 and 0.3 mm. As illustrated in FIG. 2, the rail coupling member 2 is a belt-like sheet member, and a pin hole 2a and an opening 2b are formed near each end.

The size of each pin hole 2a is large enough to allow the pin 4a of the rail member 4 to be inserted. The size of each opening 2b is large enough to allow the support portion 4c of the rail member 4 to be inserted. The rail coupling member 2 is readily formed by press-punching a sheet member in the shape illustrated in FIG. 2. The pin holes 2a and the openings 2b are also formed when the press-punching operation is performed.

Note that in the example illustrated in FIG. 1, the vicinity of each end of the rail coupling member 2 is slightly bent. This arrangement facilitates insertion of the support portions 4c of the rail members 4 into the openings 2b, and also facilitates insertion of the projections 4a of the rail members 4 into the pin holes 2a after the support portions 4c are inserted into the openings 2b. The bent arrangement may be also made using a punching die when the press-punching operation is performed. Note however that the rail coupling member 2 does not necessarily need to be bent, and may be flat in shape as illustrated in FIG. 2.

In the example of FIG. 1, the rail coupling member 2 is smaller in width in the midsection compared to the end portions. This arrangement is made for the purpose of not interfering with connecting cables, connectors and the like led from the front or the back side of the unit when the rail members 4 coupled by the rail coupling member 2 are attached to the unit, as described below. The rail coupling member 2 is a thin, flexible plastic sheet, and hence, when the unit is housed in the slot of the chassis or frame, the rail coupling member 2 is deformed in such a manner as to extend along the front or the back side of the unit at a position as close to the front or the back side as possible. Accordingly, the rail coupling member 2 does not occupy a large space when the unit is mounted on the chassis or frame, and there is no need to provide a space dedicated to the rail coupling member 2. As described above, by making the rail coupling member small or cutting out a part of the rail coupling member, the rail coupling member 2 being deformed can be disposed close to the unit in such a manner as not to interfere with the connecting cables and connectors of the unit. Since it is formed by press-punching a thin plastic sheet, the rail coupling member 2 can be made to have an arbitrary width, or have cut-out portions of arbitrary shapes.

Figure 3:
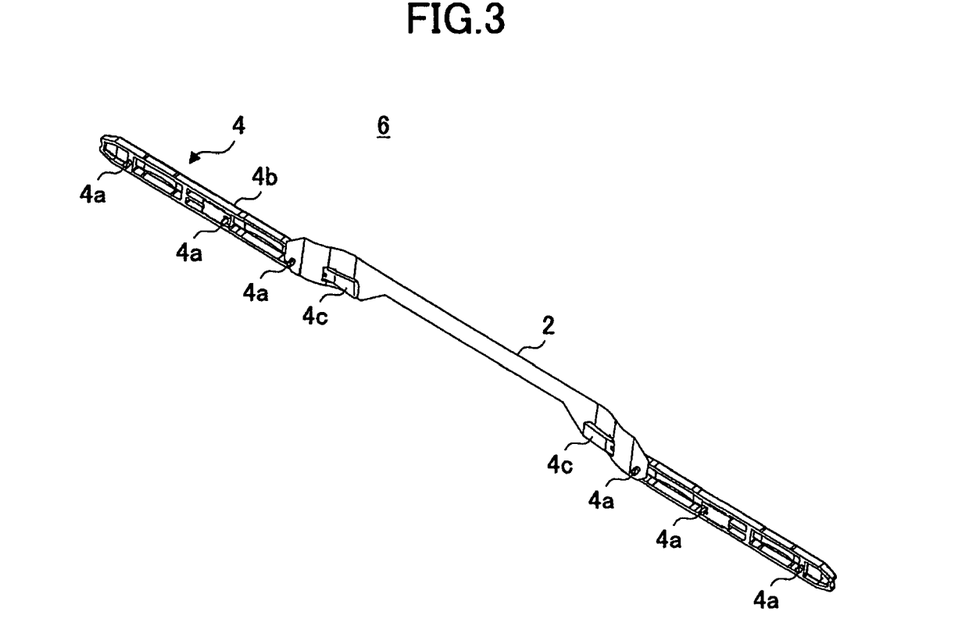
FIG. 3 is a perspective view of a rail member assembly.
Figure 4:
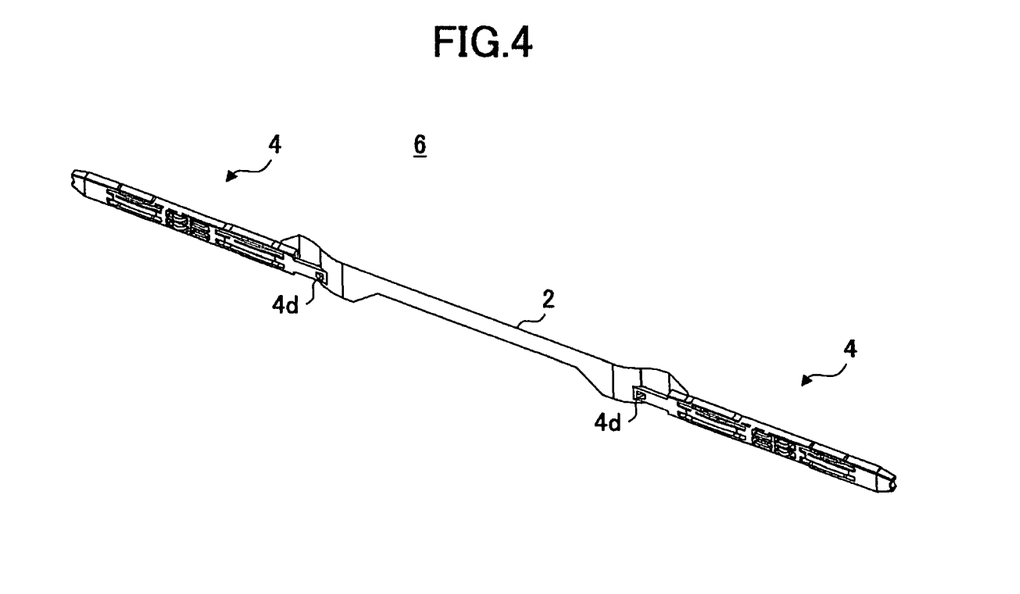
FIG. 4 is another perspective view of the rail member assembly.

FIG. 3 is a perspective view of a rail member assembly 6 formed by coupling the paired rail members 4 by the rail coupling member 2. FIG. 4 is a perspective view of the rail member assembly 6 of FIG. 3 viewed from the opposite side.

The tip end of the support portion 4c of each of the rail members 4 is inserted into the corresponding opening 2b of the rail coupling member 2. In the central part of each of the support portions 4c, a wedge-shaped projection 4d is formed as illustrated in FIG. 4, and the support portions 4c are inserted short of the corresponding projections 4d. In this condition, the pin holes 2a of the rail coupling member 2 reach the positions of the pins 4a of the corresponding rail members 4. The pins 4a of the rail members 4 are then inserted into the pin holes 2a of the rail coupling member 2, whereby the rail members 4 and the rail coupling member 2 are connected to each other.

Figure 5:
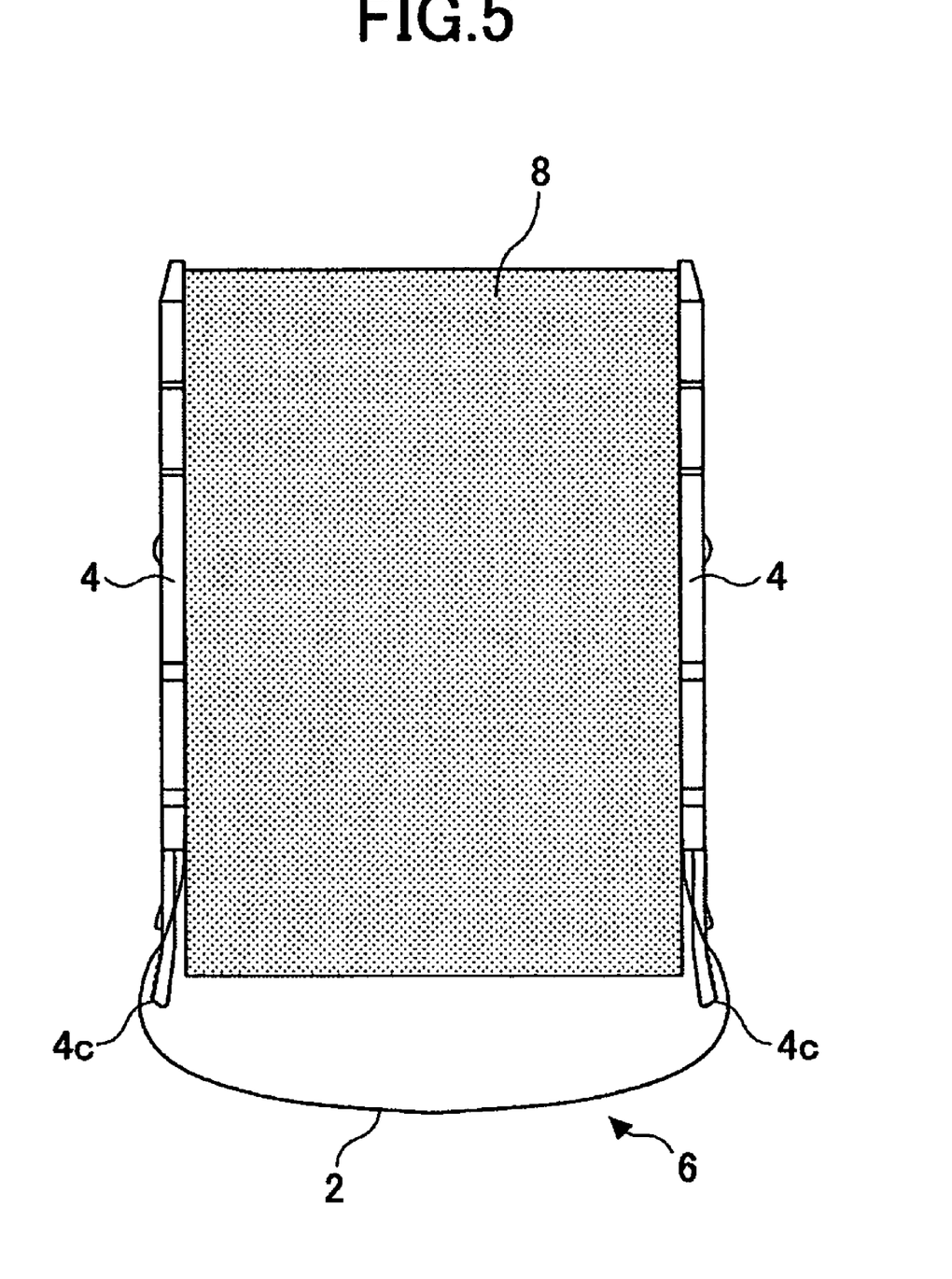
FIG. 5 is a plan view of a unit to which the rail member assembly is attached.

After the rail members 4 are connected to corresponding ends of the rail coupling member 2 in the above-described manner, the rail members 4 are attached one to each of the right and left lateral sides of a unit 8 (e.g. a hard disk device), which is to be mounted on the chassis or frame, as illustrated in FIG. 5. At this point, the pins 4a of the rail members 4 fit into the pin holes provided on the corresponding lateral sides of the unit 8, whereby the rail members 4 are fixed to the lateral sides of the unit 8. The engagement of the pins 4a is not too tight, and loose enough to allow the rail members 4 to be taken out from the unit 8.

Figure 6:
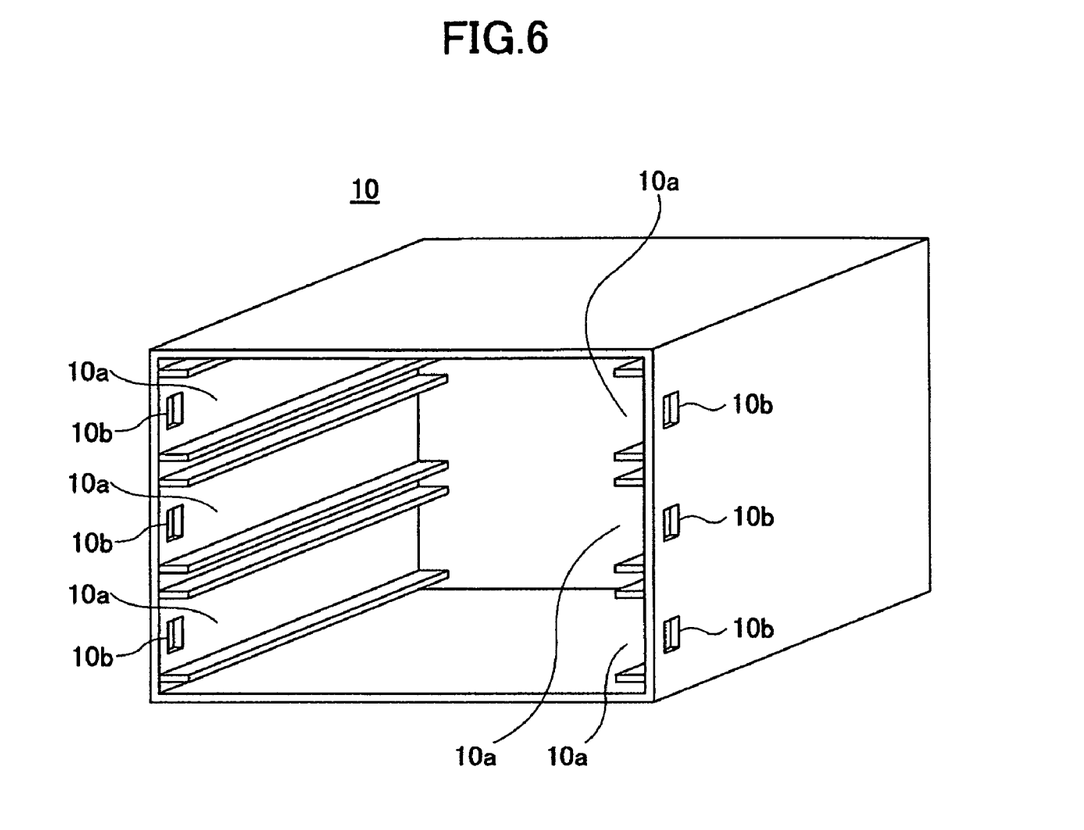
FIG. 6 is a simplified perspective view of a chassis or a frame on which the unit is mounted.

After the rail member assembly 6 is attached to the unit 8 in the above-described manner, the unit 8 is inserted into a slot of a frame 10 (hereinafter, simply referred to as "frame 10") together with the rail member assembly 6, as illustrated in FIG. 6. FIG. 6 is a simplified perspective view of the frame 10 on which the unit 8 is mounted. In each slot of the frame 10, rail channels 10a are formed for supporting the right and left rail members 4. The rail members 4 are supported on the frame 10 when inserted into the rail channels 10a, whereby the unit 8 is supported on the frame 10 via the rail members 4. On the frame 10, openings 10b are provided which the projections 4d engage in order to secure the rail members 4 as described below.

Figure 7:
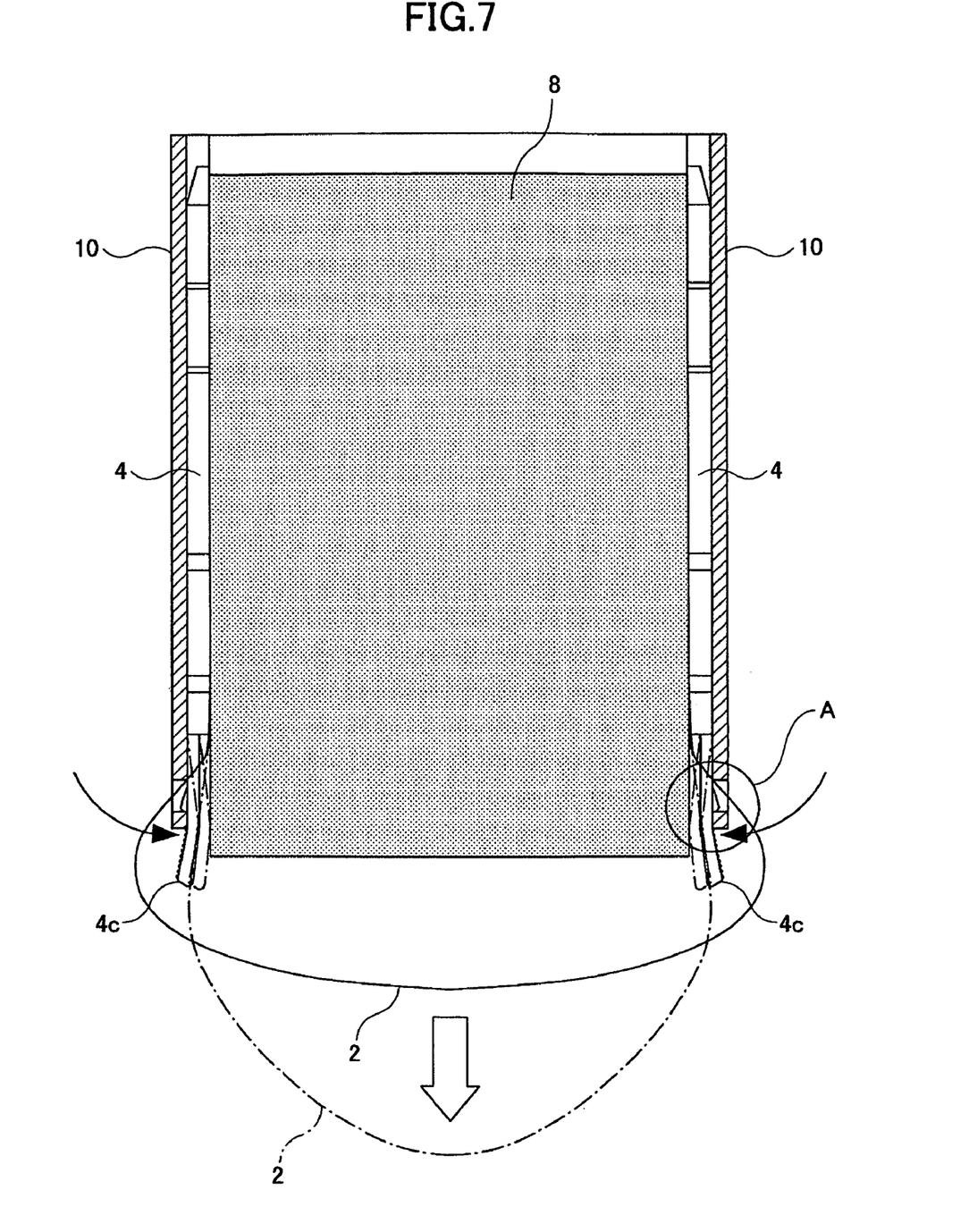
FIG. 7 is a plan view showing the unit mounted on the chassis or frame.
Figure 8:
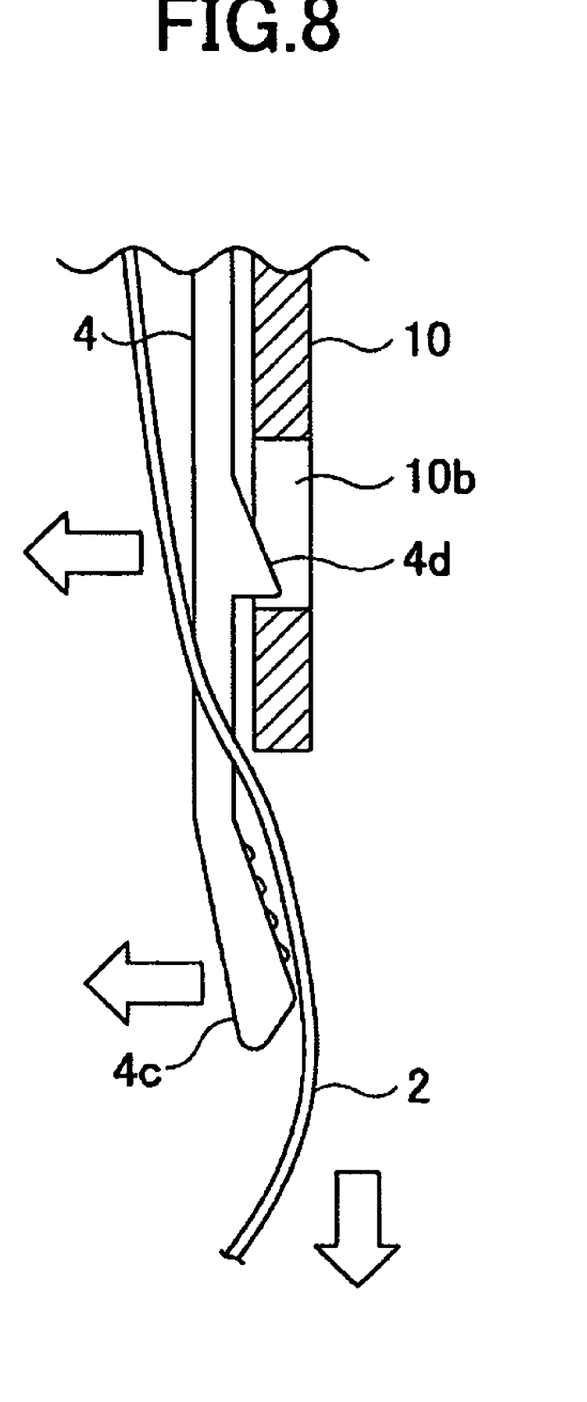
FIG. 8 is an enlarged view of the part A in FIG. 7.

FIG. 7 is a plan view showing the unit 8 mounted on the frame 10. FIG. 8 is an enlarged view of the part A in FIG. 7. When the rail members 4 are inserted into the rail channels 10a and the entire unit 8 is housed in the frame 10, the wedge-shaped projections 4d protruding outward from the support portions 4c of the rail members 4 fit into and engage the openings 10b formed on the frame 10. Herewith, the rail members 4 are fixed to the frame 10 in position with the unit 8 housed in the frame 10.

In the case of replacing the unit 8, for example, the unit 8 needs to be taken out from the frame 10. Conventionally, the projections 4d are disengaged from the openings 10b by bending inward the support portions 4c of the right and left rail members 4, and the two rail members 4 are then pulled out at the same time, whereby the unit 8 is taken out from the frame 10 together with the rail members 4. In this operation, a person needs to pull out the unit 8 while bending the rail members 4 using both hands. Accordingly, it is necessary to provide a space allowing two hands to be put in near the unit 8.

On the other hand, according to the unit support mechanism of the present embodiment, the use of the above-described rail member assembly 6 allows the unit 8 to be readily pulled out from the frame 10 together with the rail member assembly 6, and thus, eliminates the need for providing a large space near the unit 8.

That is, as illustrated in FIG. 7, when the central part of the rail coupling member 2 is pulled, because the ends of the rail coupling member 2 are fixed to the corresponding right and left rail members 4, the rail coupling member 2 loses its slack and is pulled inward as indicated by the dashed-dotted line of FIG. 7. Since the support portions 4c of the rail members 4 are inserted into the openings 2b of the rail coupling member 2 and extend on the inner side of the rail coupling member 2, when the rail coupling member 2 is pulled inward, the support portions 4c also bend inward. Herewith, the projections 4d protruding from the outer lateral sides of the support portions 4c disengage from the openings 10b of the frame 10. The rail members 4 are pulled by the rail coupling member 2, and therefore, by pulling the rail coupling member 2, the unit 8 is pulled out from the frame 10 together with the rail members 4.

As has been described above, the unit 8 can be readily taken out from the chassis or frame by pulling the central part or its vicinity of the rail coupling member 2 with one hand. Accordingly, there is no need to provide around the unit a space large enough to allow two hands to be put in, and it is hence possible to effectively use the space in the electronic device. In addition, the unit can be disposed at a place where the conventional unit cannot be disposed due to not being able to provide a space allowing two hands to be put in. This improves the flexibility of the positionings of the unit and components of the electronic device as well as the flexibility of the design.

Furthermore, since the rail coupling member 2 is formed of a thin, flexible plastic sheet, it can be changed in shape when not in use so as to follow the shapes of the surrounding components and the unit 8, thus having no interference with the surrounding components, wiring and the like. Note that the rail coupling member 2 is not limited to a plastic sheet, and any kind of sheet member, for example, made of cloth or paper may be used provided that it is thin and flexible.

The rail coupling member 2 of the present embodiment is readily formed by simply punching a plastic sheet, hence not generating substantial costs for making the rail coupling member 2. For example, if the rail members 4 and the rail coupling member 2 are integrally formed by plastic molding, a large resin mold is required; however, only a punching die is necessary for making the rail coupling member 2, having only a marginal impact on the production cost of the electronic device.

All examples and conditional language used herein are intended for pedagogical purposes to aid the reader in understanding the present disclosure and the concepts contributed by the inventor to furthering the art, and are to be construed as being without limitation to such specifically recited examples and conditions, nor does the organization of such examples in the specification relate to a showing of the superiority or inferiority of the present disclosure. Although the embodiment of the present disclosure has been described in detail, it should be understood that various changes, substitutions, and alterations could be made hereto without departing from the spirit and scope of the present disclosure.

What is claimed is:

1. A rail coupling arrangement comprising:
    a pair of rail members removably attached to a pair of lateral sides of a unit, the unit being detachably supported by a frame of an electronic device, and the pair of rail members facilitating removal of the unit from the frame; and
    a flexible handle including end portions, the end portions detachably coupled to the pair of rail members,
    wherein the rail members of the pair of rail members each includes a support portion having a projection which protrudes in a direction away from the pair of lateral sides of the unit when the pair of rail members coupled by the flexible handle is attached to the unit, the projection removably engaging a corresponding recession portion in the frame, and
    wherein when the unit is being removed from the frame, a first force, applied to a substantially central portion of the flexible handle and in a first direction substantially parallel to the pair of rail members, causes the flexible handle to deform such that at least some of the first force is manifested as a second force applied in a second direction substantially perpendicular to the first direction, and the second force being applied to at least one of the rail members that includes the projection, the second force causing the projection of the rail member to move in the second direction away from the corresponding recess portion in the frame so as to disengage the projection.

2. The rail coupling arrangement as claimed in claim 1, the flexible handle further comprising:

openings disposed in the vicinity of ends thereof, wherein the support portions of the pair of rail members penetrate through the corresponding openings and the end portions are fixed to the rail members.

3. The rail coupling arrangement as claimed in claim 1, wherein the flexible handle is a sheet member.

4. The rail coupling arrangement as claimed in claim 3, wherein the flexible handle is made of a flexible plastic sheet and formed by punching.

5. A unit support system for supporting a unit in an electronic device, the unit support system comprising:

a pair of rail members removably attached to a pair of lateral sides of the unit, the unit being detachably supported in the electronic device, and the pair of rail members facilitating removal of the unit from the electronic device;

a flexible handle including end portions, the end portions detachably coupled to the pair of rail members; and a frame for supporting, in the electronic device, the unit via the pair of rail members, wherein the rail members of the pair of rail members each includes a support portion having a projection which protrudes in a direction away from the pair of lateral sides of the unit when the pair of rail members coupled by the flexible handle is attached to the unit, the projection removably engaging a corresponding recession portion in the frame, and wherein when the unit is being removed from the frame, a first force, applied to a substantially central portion of the flexible handle and in a first direction substantially parallel to the pair of rail members, causes the flexible handle to deform such that at least some of the first force is manifested as a second force applied in a second direction substantially perpendicular to the first direction, and the second force being applied to at least one of the rail members that includes the projection, the second force causing the projection of the rail member to move in the second direction away from the corresponding recess portion in the frame so as to disengage the projection.

6. The unit support system as claimed in claim 5, wherein the frame includes rail channels into which the rail members are inserted to support the unit with the rail channel via the pair of rail members.

7. An electronic device comprising:

a unit support mechanism for supporting a unit to be attached to and detached from the electronic device, wherein the unit support mechanism includes a pair of rail members attached to a pair of lateral sides of the unit, the unit being detachably supported in the electronic device, and the pair of rail members facilitating removal of the unit from the electronic device;

a flexible handle including end portions, the end portions detachably coupled to the pair of rail members; and a frame for supporting, in the electronic device, the unit via the pair of rail members, wherein the rail members of the pair of rail members each includes a support portion having a projection which protrudes in a direction away from the pair of lateral sides of the unit when the pair of rail members coupled by the flexible handle is attached to the unit, the projection removably engaging a corresponding recession portion in the frame, and wherein when the unit is being removed from the frame, a first force, applied to a substantially central portion of the flexible handle and in a first direction substantially parallel to the pair of rail members, causes the flexible handle to deform such that at least some of the first force is manifested as a second force applied in a second direction substantially perpendicular to the first direction, and the second force being applied to at least one of the rail members that includes the projection, the second force causing the projection of the rail member to move in the second direction away from the corresponding recess portion in the frame so as to disengage the projection.

\* \* \* \* \*